(12) United States Patent  (10) Patent No.: US 7,753,108 B2
Lai et al.  (45) Date of Patent: Jul. 13, 2010

(54) LIQUID COOLING DEVICE

(75) Inventors: Cheng-Tien Lai, Taipei Hsien (TW);
Zhi-Yong Zhou, Shenzhen (CN);
Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 689 days.

(21) Appl. No.: 11/565,910

(22) Filed: Dec. 1, 2006

(65) Prior Publication Data

US 2008/0128114 A1  Jun. 5, 2008

(51) Int. Cl.
*F28F 7/02* (2006.01)
(52) U.S. Cl. .................................. 165/80.4; 165/80.5
(58) Field of Classification Search ............... 165/80.4, 165/80.5, 147
See application file for complete search history.

(56) References Cited

U.S. PATENT DOCUMENTS

| 2,100,747 | A | * | 11/1937 | Mouromtseff | 165/80.4 |
| 5,070,936 | A | * | 12/1991 | Carroll et al. | 165/80.4 |
| 5,727,618 | A | * | 3/1998 | Mundinger et al. | 165/80.4 |
| 6,526,768 | B2 | | 3/2003 | Wall et al. | |
| 7,143,815 | B2 | | 12/2006 | Lee et al. | |
| 7,407,000 | B2 | | 8/2008 | Lee et al. | |

FOREIGN PATENT DOCUMENTS

| CN | 2701074 Y | 5/2005 |
| CN | 1797276 A | 7/2006 |

* cited by examiner

*Primary Examiner*—Teresa J Walberg
(74) *Attorney, Agent, or Firm*—Jeffrey T. Knapp

(57) ABSTRACT

A cooling plate of a liquid cooling includes a chamber hermetically defined therein, an outlet, and an inlet. The outlet and the inlet communicate with the chamber for circulating liquid through the chamber. One of the outlet and the inlet is located in the other one of the outlet and the inlet.

11 Claims, 8 Drawing Sheets

LIQUID COOLING DEVICE

CROSS REFERENCE

Relevant subject matter is disclosed in a U.S. patent application Ser. No. 11/204,688, filed on Aug. 25, 2005 and entitled "LIQUID COOLING DEVICE", now published as Pub. No. US 2006/0137863A1, and also Ser. No. 11/164,282, filed on Nov. 17, 2005 entitled "HEAT DISSIPATION DEVICE", both of which are assigned to the same assignee as this application and incorporated herein by reference.

BACKGROUND OF THE INVENTION

1. Field of the Invention

The present invention relates to a cooling device, and more particularly to a liquid cooling device for rapidly cooling a heat producing component such as a central processing unit (CPU).

2. Description of Related Art

Over the past few years, CPU speeds have been increasing at a dramatic rate. In order to achieve this, CPUs have ever-higher levels of integration, are drawing more power and have higher clock rates. This leads to greater heat being produced by the CPU in the computer. The waste heat can accumulate and generate unacceptable high temperatures and thermal stress in the CPU, resulting in reliability performance degradation and system malfunction. Heat sinks have been added to all modern PC CPUs to help try to dissipate some of the heat from the processor into the surrounding environment, many of these heat sinks also include fans to help dissipate heat, but CPU temperatures have increased to the point where fan cooling is no longer sufficient and liquid cooling is now coming into use.

Liquid cooling essentially acts like a radiator for the CPU inside the computer. A liquid cooling system circulates a liquid through a cooling plate attached to the processor inside the computer. As the liquid passes through the cooling plate, heat is transferred from the hot processor to the cooler liquid. The hot liquid then moves out to a heat sink and transfers heat to the ambient air flowing through the heat sink. The cooled liquid then travels back through the system to the CPU to continue the process.

A liquid cooling device 70 in accordance with related art is shown in FIG. 8. The liquid cooling device 70 generally comprises a pump 72, a cooling plate 74, and a heat sink 76 defining a chamber therein. A zigzagged passageway 762 is defined in the chamber of the heat sink 76 by a plurality of parallel partitions for carrying liquid coolant. The pump 72 defines a first inlet 722 and a first outlet 724 away from the first inlet 722. The cooling plate 74 defines a second inlet 742 and a second outlet 744 connecting with the first inlet 722 of the pump 72. A pipe 77 connects an inlet (not labeled) of the heat sink 76 and the first outlet 724 of the pump 72. An outlet (not labeled) of the heat sink 76 is connected to the second inlet 742 of the cooling plate 74 through another pipe 78. Thus, the heat sink 76, the pump 72 and the cooling plate 74 together form a circuit for transferring heat from a heat producing component (not shown) to the liquid coolant contained in the circuit and for dissipating the heat at the cooling plate 74.

However, there is one key limitation of the liquid cooling device 70 that has prevented its widespread adoption, that is, leakage. The fluid-handling components must all be connected to each other with pipes, resulting in a minimum of six connection joints shown in FIG. 8. That means that the liquid coolant (typically water) that runs through this liquid cooling device 70 has a minimum of six different locations where a leak is possible, not to mention the possibility of leaks occurring somewhere in the pipe itself. More particularly, the cooling plate 74 communicates with the heat sink 76 and the pump 72 via two pipes; thus, two connection joints are formed adjacent to a heat producing component, which is placed under the cooling plate 74. This increases the risk of the heat producing component failure or damage due to leakage. The fear of water leakage in the computer is enough to prevent some users/designers from adopting this technology.

What is needed, therefore, is a liquid cooling device for a heat producing component, which can decrease the possibility of leaks.

SUMMARY OF THE INVENTION

A cooling plate for use with a liquid cooling device is disclosed. The cooling plate comprises a chamber hermetically defined therein, an outlet, and an inlet. The outlet and the inlet communicate with the chamber for liquid circulating through the chamber. One of the outlet and the inlet is located in the other one of the outlet and the inlet.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
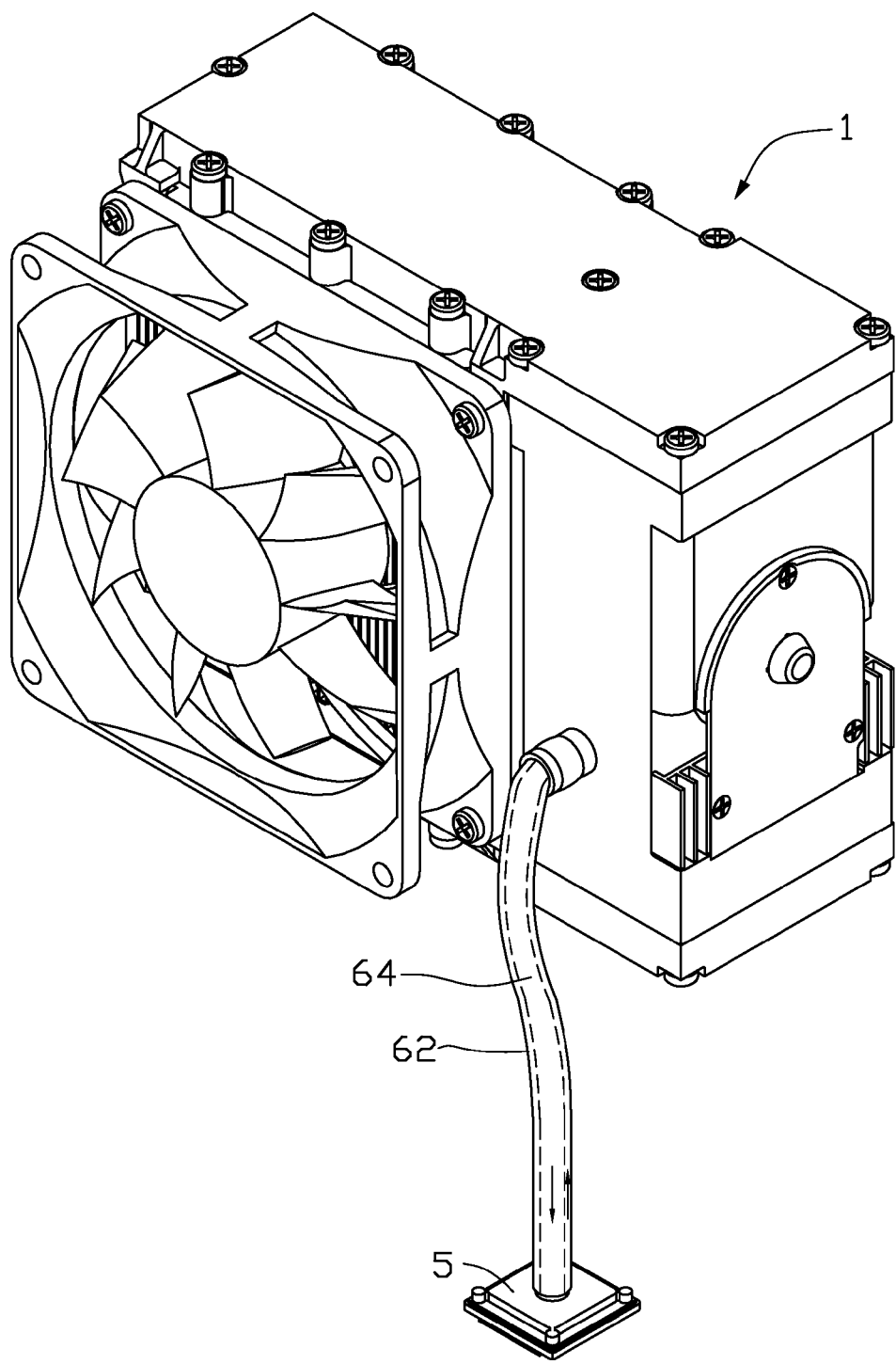
FIG. 1 is an assembled view of a liquid cooling device in accordance with a preferred embodiment.
Figure 2:
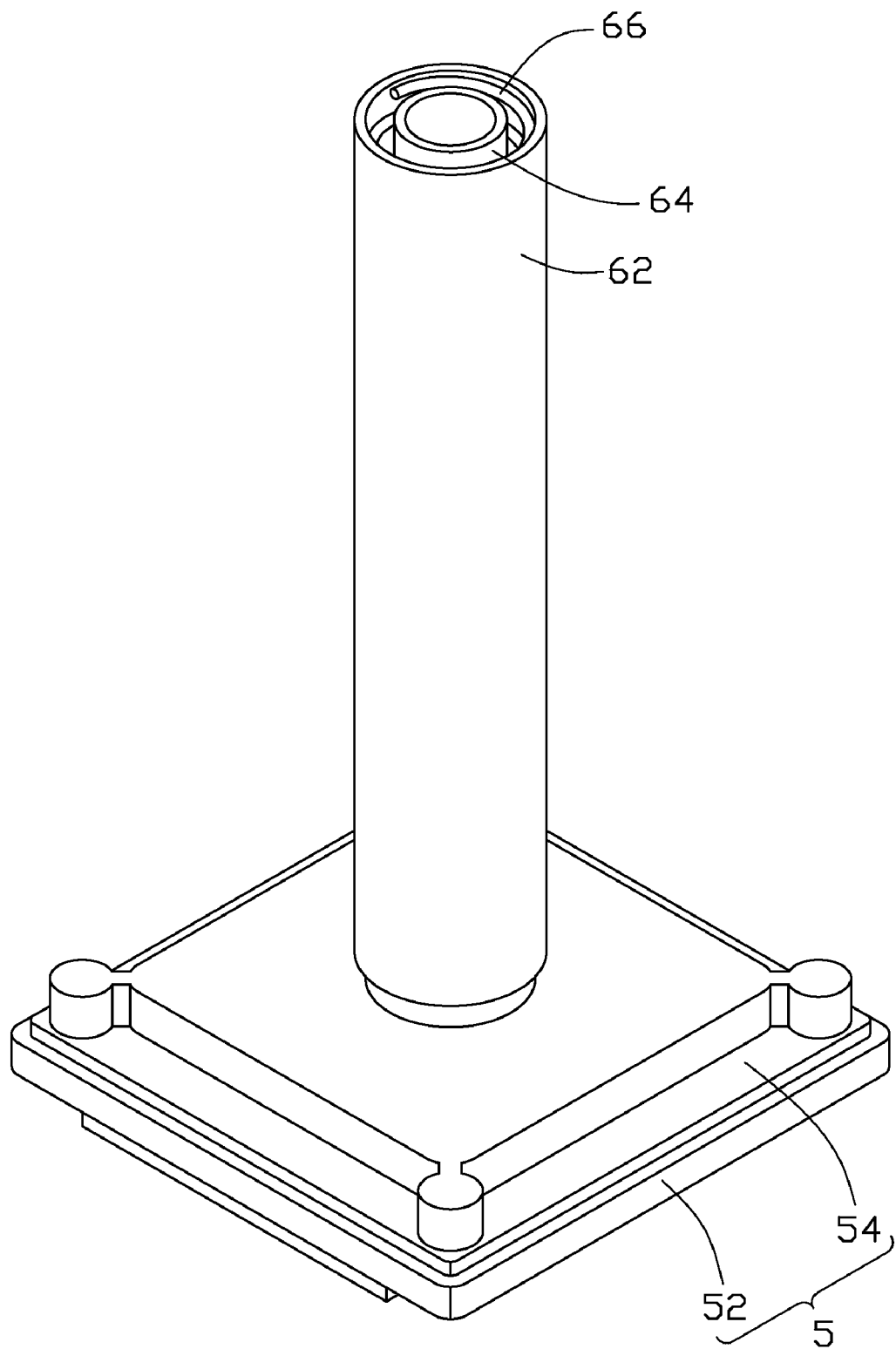
FIG. 2 is an enlarged view of a cooling plate of the liquid cooling device shown in FIG. 1, together with parts of pipes of the liquid cooling device shown in FIG. 1.

Referring to FIG. 1, a liquid cooling device in accordance with a preferred embodiment is illustrated. The liquid cooling device generally comprises a heat-dissipating unit 1, a cooling plate 5, a first pipe 62 extending from the cooling plate 5 to the heat-dissipating unit 1, and a second pipe 64 (shown in dotted lines) positioned in the first pipe 62 and extending from the cooling plate 5 to the heat-dissipating unit 1 along with the first pipe 62.

The cooling plate 5 thermally contacts with a heat producing component (not shown), such as a CPU, and serves as a heat-absorbing unit for the liquid cooling device. The structure of the cooling plate 5 gives an important weight to the performance of the whole liquid cooling device. Thus, the detailed structure of the cooling plate 5 will be described first.

Referring to FIGS. 2-5, the cooling plate 5 generally comprises a base 52 and a cover 54. The cover 54 is directly disposed on and covers the base 52; as a result, a hermetical chamber is defined therebetween.

Figure 4:
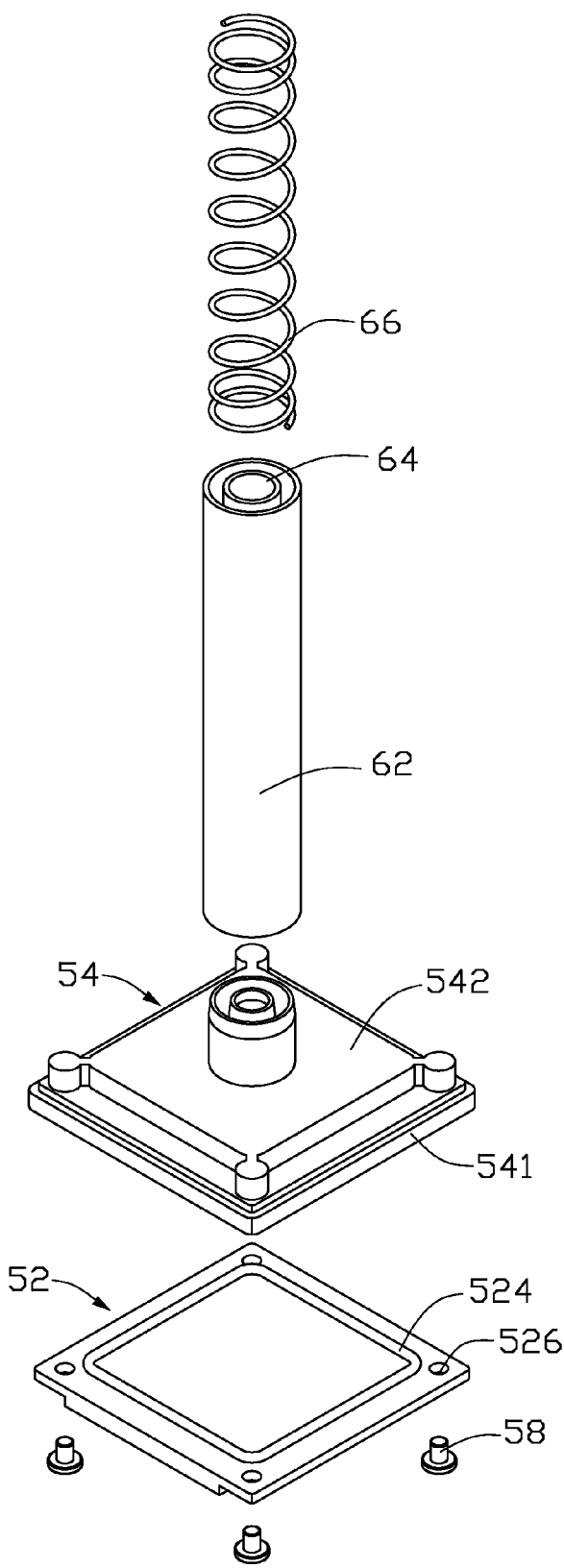
FIG. 4 is an exploded, isometric view of the cooling plate and the pipes shown in FIG. 2.

The base 52 is used for contacting with the CPU, and absorbs heat originating from the CPU. In order to reduce the heat resistance between the base 52 and the CPU, the base 52 is usually designed to have a flat bottom surface, for directly contacting with the CPU. Alternatively, thermal grease may be positioned between the CPU and the base 52. In a top portion of the base 52, a rectangular seal groove 524 is defined adjacent to the periphery of the base 52, for snuggly receiving a rectangular seal or gasket 56 therein. As shown in FIG. 4, the rectangular seal groove 524 is surrounded by four through holes 526, which are defined in corners of the base 52. Four screws 58 extend through the through holes 526 of the base 52, engage with the cover 54, then the base 52 is secured to the cover 54.

The cover 54 comprises four sidewalls 541 perpendicularly and downwardly extending from four sides of the cover 54. When the cover 54 is disposed on the base 52, the sidewalls 541 of the cover 54 enclose a periphery of the base 52. In other words, the base 52 is partially received in the cover 54.

Figure 3:
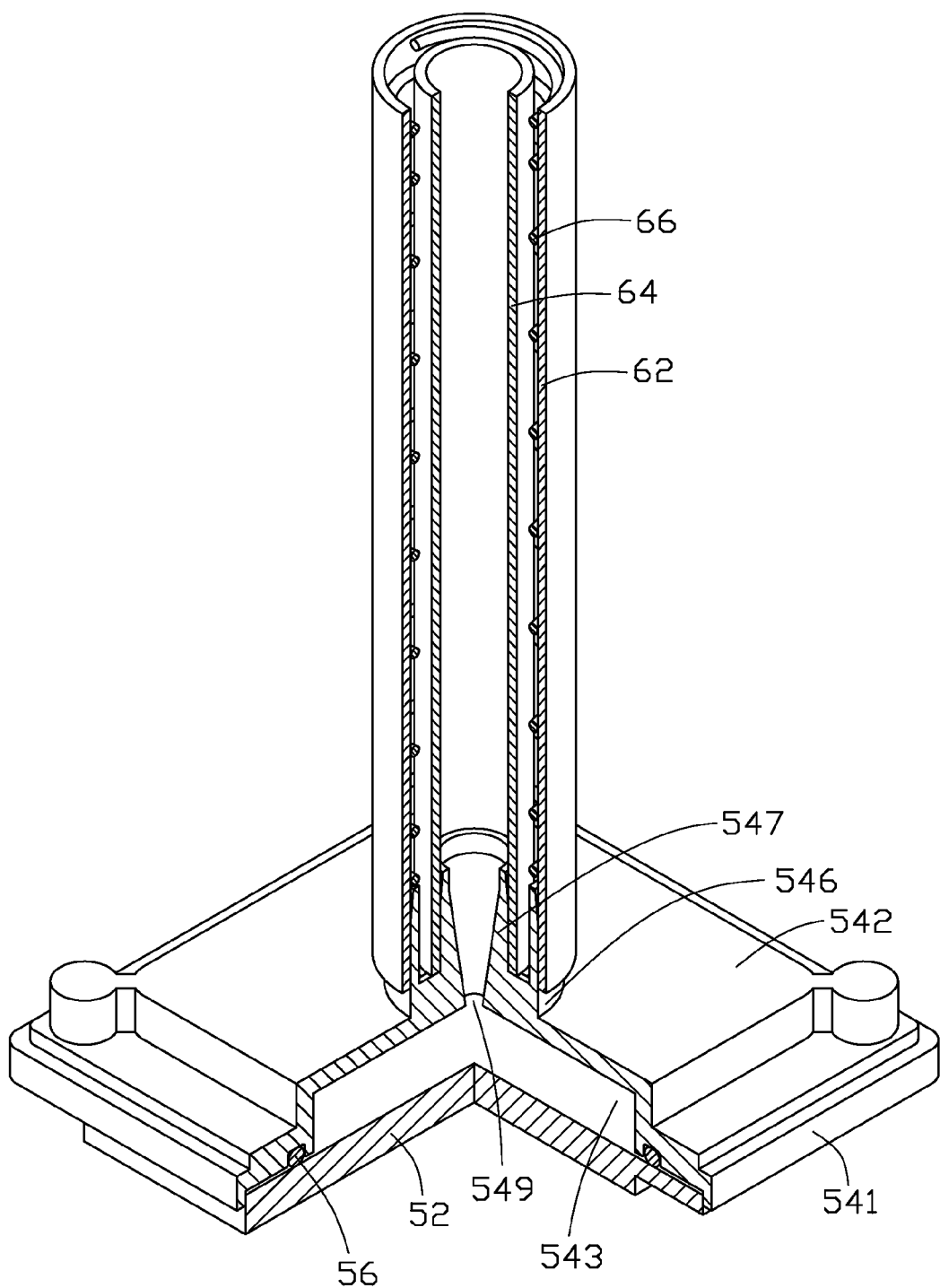
FIG. 3 is similar to FIG. 2, but a part of the cooling plate and the pipes removed to clearly show inner structure thereof.

In this preferred embodiment, a protrusion 542 projects upwardly from the cover 54 and a cavity 543 is defined in the protrusion 542 of the cover 54 (clearly seen in FIG. 3). A rectangular seal channel 544 is defined in the cover 54, and surrounds the cavity 543. The rectangular seal channel 544 is formed corresponding to the rectangular seal groove 524 of the base 52. Four threaded holes 545 are defined in corners of the cover 54. Moreover, the four threaded holes 545 of the cover 54 are located in a space defined between the rectangular seal channel 544 and the sidewalls 541 of the cover 54. These threaded holes 545 of the cover 54 are positioned corresponding to the through holes 526 of the base 52.

When assembling the cover 54 to the base 52, the cover 54 is first positioned on the base 52 with the rectangular gasket 56 snuggly received in the seal groove 524 of the base 52 and the seal channel 544 of the cover 54, simultaneously. At the same time, the sidewalls 541 of the cover 54 enclose the periphery of the base 52. The sidewalls 541 of the cover 54 function as rails for guiding the base 52 so as to quickly position it in the cover 54 with the through holes 526 of the base 52 aligning with corresponding threaded holes 545 of the cover 54. This facilitates assembly, and is timesaving. The screws 58 are then pushed to extend through the through holes 526 of the base 52, and are then screwed into the threaded holes 545 of the cover 54, and the cover 54 and the base 52 are securely assembled. Meanwhile, the seal gasket 56 is squeezed to deform, as a result, the cavity 543 of the cover 54 is hermetically sealed. Thus, the cavity 543 serves as a liquid container when the cover 54 and the base 52 are assembled together to form the cooling plate 5.

In order to further ensure that the cavity 543 of the cover 54 is hermitically sealed, another seal or gasket may be positioned between the sidewalls 541 of the cover 54 and the periphery of the base 52. For another embodiment, the sidewalls 541 of the cover 54 may be securely fixed to base 52 along the periphery of the base 52 via welding or joining, and other conventional methods. This can also ensure the degree of reliability of seal of the cooling plate 5.

The cover 54 further comprises an outer tube 546 and an inner tube 547 for the liquid flowing into or out of the cavity 543 of the cooling plate 5, which is hermetically sealed as described above. The inner tube 547 is coaxially positioned in the outer tube 546. The outer tube 546 and the inner tube 547 are projected upwardly from the protrusion 542, and a ring shaped space is formed therebetween.

Figure 5:
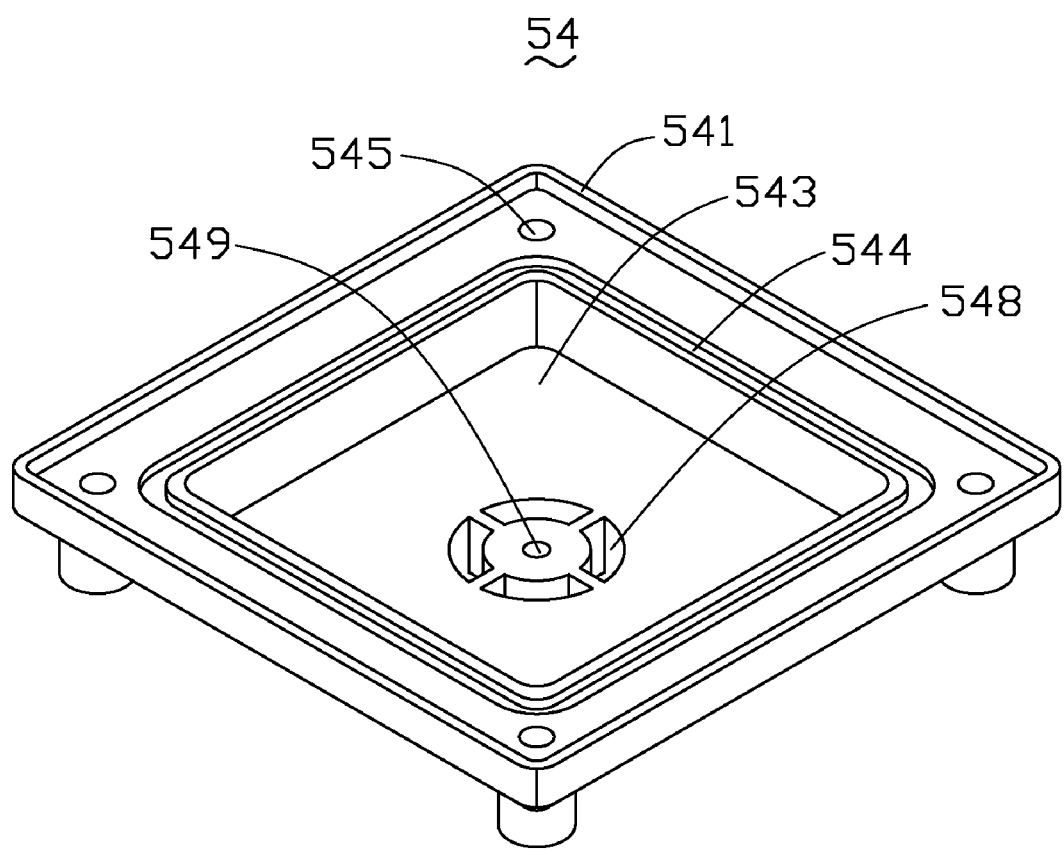
FIG. 5 is an enlarged view of a cover of the cooling plate of FIG. 4, taken from a different aspect.

The ring shaped space communicates with the cavity 543 via four cutouts 548 symmetrically formed in the cover 54 between the inner tube 547 and the outer tube 546. The inner tube 547 communicates with the cavity 543 of the cover 54 via a through hole 549 defined in the protrusion 542, particularly a central portion of the cover 54. More particularly, the cutouts 548 are symmetrically located around the through hole 549 of the cover 54 as shown in FIG. 5. Therefore, the ring shaped space and the inner tube 547 provide two paths for the liquid circulating in the cooling plate 5. When one of the two paths is selected for the liquid flowing into the cooling plate 5, the other one is then for the liquid leaving from the cooling plate 5 and vice-versa.

In this preferred embodiment, the ring shaped space is selected to provide a path for the liquid flowing out of the cooling plate 5; therefore, the cutouts 548 of the cover 54 function as an outlet for the cooling plate 5. The inner tube 547 provides a path for the liquid entering into the cavity 543; therefore, the through hole 549 of the cover 54 functions as an inlet for the cooling plate 5.

The liquid enters into the cooling plate 5 from the inner tube 547, impinges on the base 52, and absorbs heat from the base 52. In order to improve the heat exchanging efficiency between the liquid and the base 52, the inner tube 547 is designed to have ability to accelerate the speed of the liquid, which enters into the cooling plate 5. Referring to FIG. 3 again, the inner tube 547 is designed to have a gradually decreasing cross-sectional area from a free end of the inner tube 547 to the through hole 549 of the cover 54. Such structure of the inner tube 547 helps to accelerate the speed of the liquid flowing into the cooling plate 5.

As is well known, the relationship between volumetric flow rate and flow velocity for liquid in a pipe is given by the basic continuity equation: Q=VA or Q/A=V (where Q=volumetric flow rate (i.e., volume of flow per unit of time), V=flow velocity, and A=cross sectional area of the pipe). The value of Q is effectively constant in the liquid cooling device, thus, the equation is changed to be: $Q_{constant}$=VA. This has the important consequence that as the area of the inner tube 547 decreases the velocity of the fluid must increase in order to keep the volumetric flow rate constant.

Thus, the inner tube 547 of this preferred embodiment can accelerate the speed of the liquid entering into the cooling plate 5. The liquid entering into the cooling plate 5 will directly impinge on a central portion of the base 52 at a relatively high speed. This serves to increase the heat exchange efficiency between the liquid and the base 52. The liquid can take more heat from the base 52 away to the heat-dissipating unit 1 to be dissipated to ambient air.

The heat-dissipating unit 1 is coupled to the cooling plate 5 via the first pipe 62 and the second pipe 64. The detailed relationship between the heat-dissipating unit 1 and the first pipe 62 and the second pipe 64, and the detailed structure of the heat-dissipating unit 1 will be described in following text.

Figure 6:
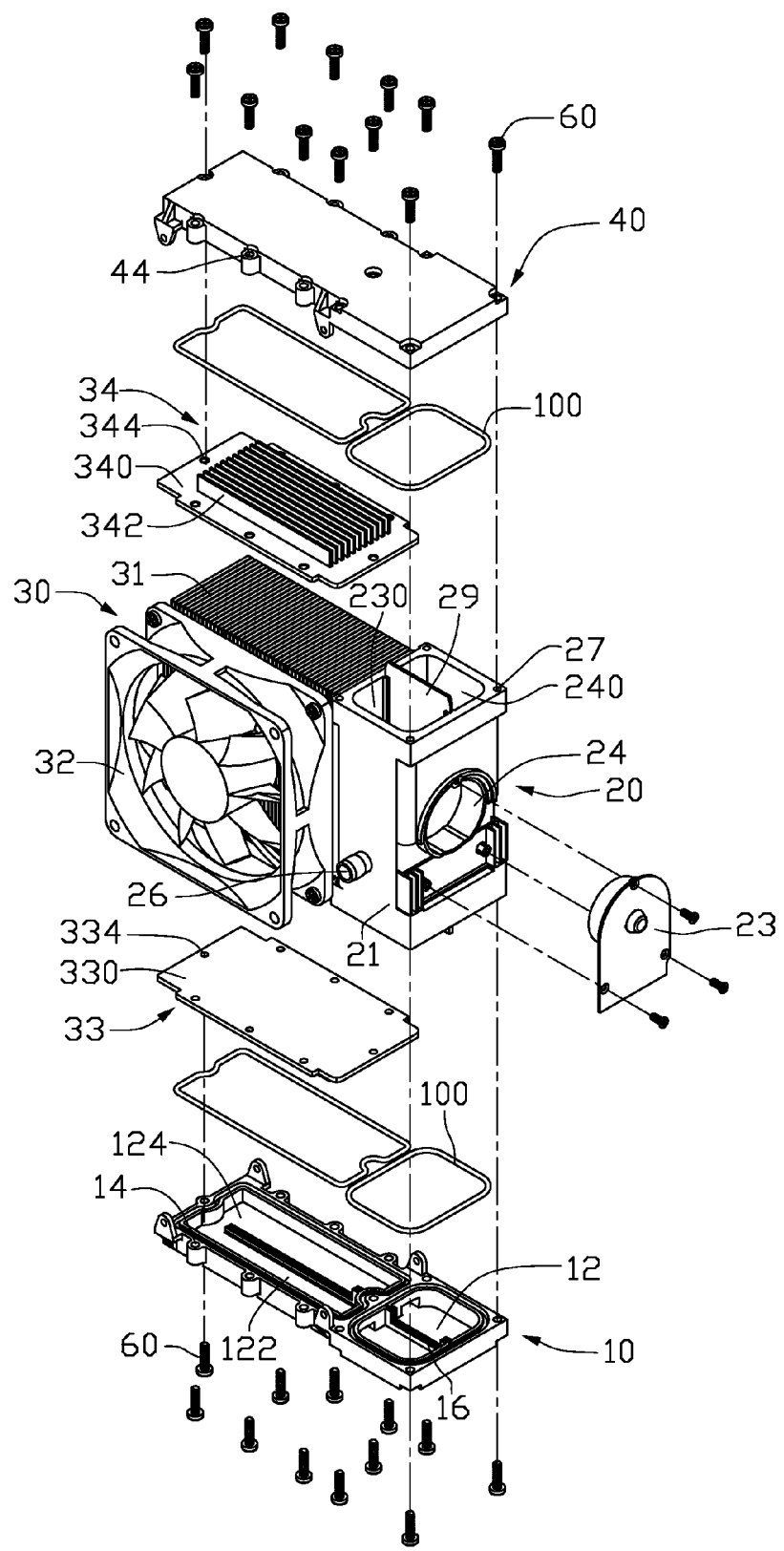
FIG. 6 is an exploded, isometric view of a heat dissipating unit of the liquid cooling device shown in FIG. 1.
Figure 7:
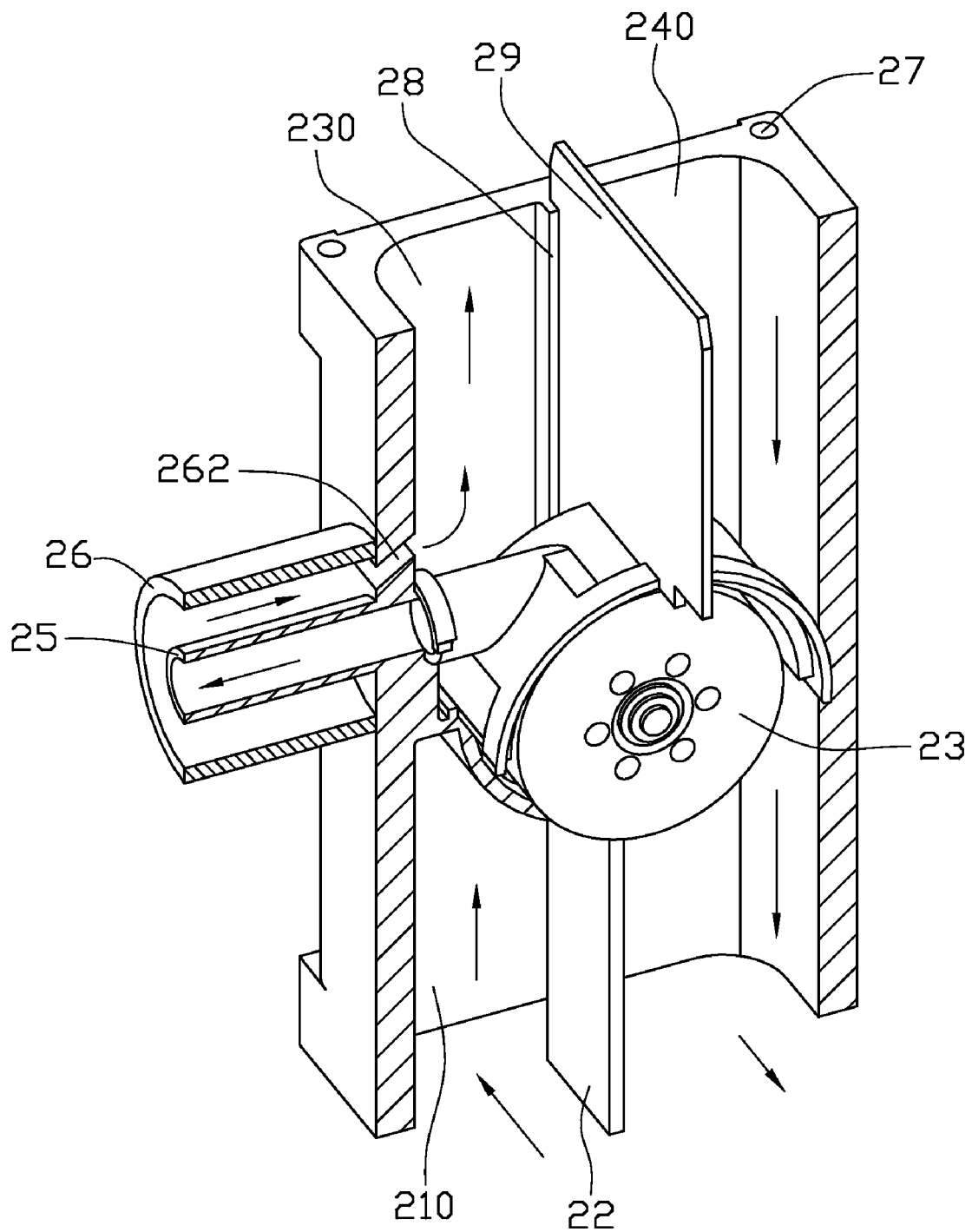
FIG. 7 is a partially sectional view of a tank of the heat dissipating unit shown in FIG. 6.
Figure 8:
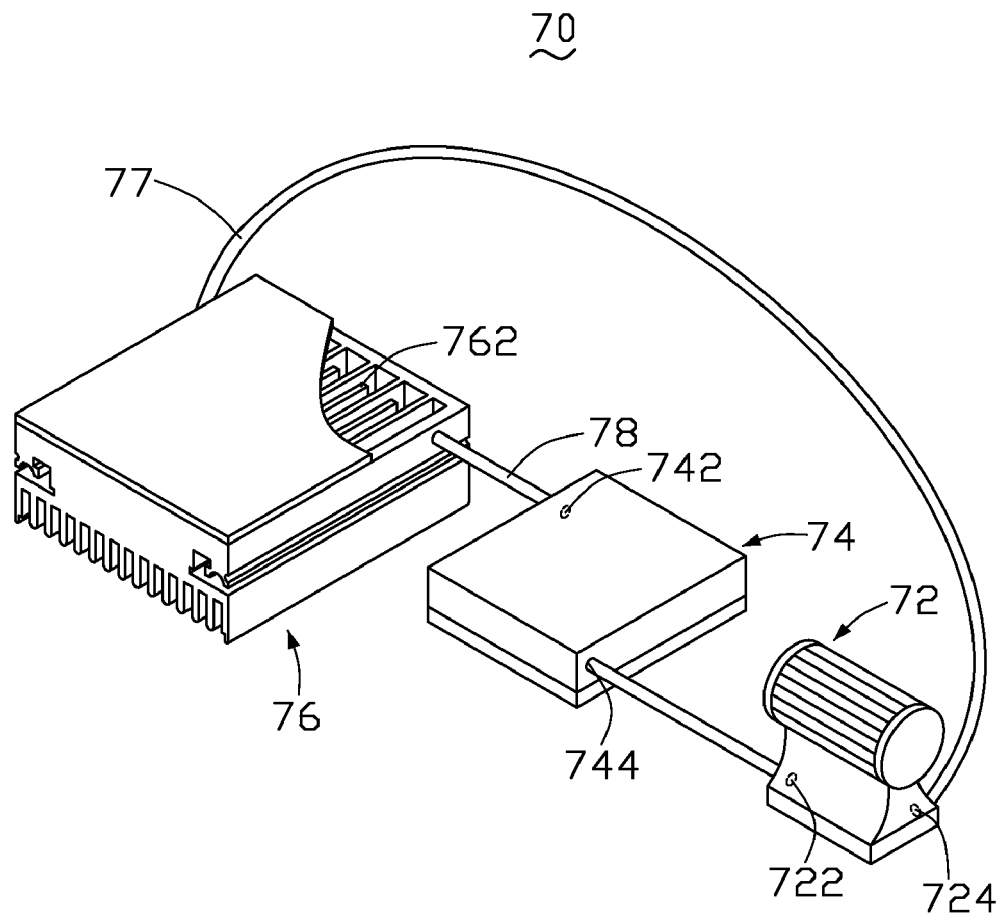
FIG. 8 is an isometric view of a liquid cooling device in accordance with related art.

Referring also to FIGS. 6 to 7, the heat-dissipating unit 1 comprises a base member 10, a tank 20, a heat dissipating body 30 and a cover member 40. The tank 20 is deposited on the base member 10. Top and bottom of the tank 20 are respectively combined with a part of the base member 10 and a part of the cover member 40. The heat dissipating body 30 is located beside the tank 20 and sandwiched between the other part of the base member 10 and the other part of the cover member 40.

The base member 10 defines a first groove 12 therein for the liquid coolant to flow through; screw holes 14 are defined around edges of sides of the base member 10 and a socket 16 is defined in a middle of the first groove 12. The socket 16 divides the first groove 12 into a first slot 122 and a second slot 124. The cover member 40 has a structure similar to that of the base member 10 and defines a second groove (not shown) and holes 44 therein.

The tank 20 has top and bottom openings, and comprises two pairs of opposite walls 21 extending from front, rear and two lateral sides of the base member 10. The tank 20 further defines a passage 24 through one lateral wall 21 of the tank 20 distant from the heat dissipating body 30 and four screw holes 27 respectively defined in four corners of the top and the bottom thereof for cooperating with the screws 60. The tank 20 comprises a pump 23, a lower clapboard 22 and an upper clapboard 29. A pair of ridges 28 is formed on an inside of the lateral wall 21 of the tank 20 for mounting the clapboards 22, 29 inside the tank 20. The pump 23 and the clapboards 22, 29 divide an inner space of the tank 20 into three portions, namely a first channel 210, a second channel 230, and a third channel 240.

The tank 20 further comprises a liquid outlet 25 and a liquid inlet 26 formed in a middle of a front wall 21 thereof. As shown in FIG. 7, the liquid outlet 25 communicates with an outlet of the pump 23, and is coaxially positioned in the liquid inlet 26. The liquid inlet 26 and the liquid outlet 25 are respectively connected with outer tube 546 and the inner tube 547 of the cooling plate 5 via the first pipe 62 and the second pipe 64.

The first channel 210 connects an inlet of the pump 23 (not shown) with the first groove 12 of the base member 10. The second channel 230 communicates with the second groove of the cover member 40 and isolated from the first channel 210. Moreover, the second channel 230 communicates with a ring-shaped space defined between the liquid outlet 25 and the liquid inlet 26 via a channel 262 defined slantwise in the front wall 21 of the tank 20. The third channel 240 is isolated from the first and second channels 210, 230 and communicates with both the first groove 12 of the base member 10 and the second groove of the cover member 40.

The heat dissipating body 30 comprises a plurality of spaced heat dissipating fins 31 defining an air flow passage (not labeled) therein, and a fan 32 secured to a front of the heat dissipating fins 31 and bottom and top conduction plates 33, 34. The bottom and top conduction plates 33, 34 are respectively placed on bottoms and tops of the heat dissipating fins 31. The bottom conduction plate 33 comprises a board 330 and a plurality of cooling fins (not shown) extending downwardly from the board 330. The board 330 defines a plurality of screw holes 334 positioned corresponding to the holes 14. The top conduction plate 34 comprises a board 340 and a plurality of cooling fins 342 extending upwardly from the board 340. The top conduction plate 34 further defines a plurality of screw holes 344 therein corresponding to the holes 44. Screws 60 are used to extend through the holes 14, 44 and screw into the screw holes 334, 344 and 27, to thereby combine the base member 10, cover member 40, bottom conduction plate 33, top conduction plate 34, tank 20 and heat dissipating body 30 together.

A part of the base member 10 is combined with the bottom conduction plate 33, and the other part is connected with the bottom of the tank 20. Two lower sealing rings 100 are used so that the base member 10 can be hermetically mounted to the bottoms of the heat dissipating body 30 and the tank 20. A part of the cover member 40 is combined with the top heat conduction plate 34 and the other part is combined with the top of the tank 20. Two upper sealing rings 100 are used so that the cover member 40 can be hermetically mounted to the tops of the heat dissipating body 30 and the tank 20.

In operation, the liquid contained in the cooling plate 5 absorbs heat from a heat producing component (not shown). Movement of the liquid is shown in FIG. 1 and FIG. 7 by arrows. The heated liquid is pumped to flow into the second channel 230 via the liquid inlet 26 and the channel 262. Then the liquid flows through the second groove of the cover member 40, during which the liquid comes into thermal contact with the cooling fins 342 of the top conduction plate 34 and transfers heat downwards to the heat dissipating fins 31. The liquid enters the third channel 240 after leaving the second groove of the cover member 40. Thereafter, the liquid reaches the second slot 124 and then the first slot 122 of the first groove 12 of the base member 10, during which the liquid comes into thermal contact with the cooling fins of the bottom conduction plate 33 and transfers heat upwards to the heat dissipating fins 31. The liquid leaves the base member 10 and is pumped to flow into the outlet of the pump 23 via the inlet thereof. Finally, the liquid flows through the liquid outlet 25, the second pipe 64, the inner tube 547 and the through hole 549 to enter the cavity 543 for a next circulation. During operation, the fan 32 generates a forced air-flow through the air flow passage of the fins 31 to increase the heat dissipating efficiency of the fins 31.

As the second pipe 64 is positioned in the first pipe 62, to prevent the ring-shaped space defined between the first pipe 62 and the second pipe 64 from being blocked due to bending, a spring 66 may be positioned therebetween. The spring 66 has an outer diameter not less than an inner diameter of the first pipe 62 to support the first pipe 62. The spring 66 may extend from the cooling plate 5 to the heat-dissipating unit 1, or extends less than a length of the first pipe 62.

As describes above, the tank 20, the pump 23, the heat dissipating body 30, the base member 10, the cover member 40, the top heat conduction plate 34 and the bottom heat conduction plate 33 are assembled together as a single unit prior to being attached to a computer system. Thus, the liquid cooling device mainly comprises two separate units, that is, the cooling plate 5 and the heat-dissipating unit 1. The whole structure of the liquid cooling device is compact; thus, it satisfies demand for miniaturization. The liquid cooling device in accordance with the present invention has a compact structure and is easy to install.

Furthermore, there are two connection joints formed between the outer tube 546 and the first pipe 62, the inner tube 547 and the second pipe 64. As the inner tube 547 of the cooling plate 5 is positioned in the outer tube 546 of the cooling plate 5 leakage in the connection joint formed between the inner tube 547 and the second pipe 64, will not affect or damage the heat generating component. Therefore, such design serves to decrease the risk of the heat generating component failure or damage due to leakage.

Moreover, the tank 20 is also designed to have the liquid outlet 25 positioned in the liquid inlet 26; this can also decrease the number of connection joints which may leak and thus damage the electronic component and reduce the reliability of the liquid cooling device.

Moreover, as shown in FIG. 1, only the first pipe 62 with the coaxial second pipe 64 is required; this serves to reduce the space that the pipes occupy and simplify the structure of the liquid cooling device.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cooling plate of a liquid cooling device, the cooling plate comprising:
   a base for thermally contacting a heat-generating electronic component;
   a first pipe;
   a second pipe received in and spaced from the first pipe;
   a cover on the base, the cover comprising an outer tube integrally extending upwardly from a top thereof and an inner tube integrally extending upwardly from a top thereof, the inner tube being received in and spaced from the outer tube;
   a chamber being hermetically defined between the base and the cover;
   an outlet; and
   an inlet;
   wherein the outer tube is hermetically received in the first pipe, and the inner tube is hermetically received in the second pipe; the outlet and the inlet communicate with the chamber for liquid circulating through the chamber, the inlet is defined in the inner tube and the second pipe, and the outlet is defined between the outer and inner tubes and between the first and second pipes.

2. The cooling plate as claimed in claim 1, wherein the inlet is coaxially positioned in the outlet.

3. The cooling plate as claimed in claim 1, wherein the base is hermetically connected with the cover.

4. The cooling plate as claimed in claim 3, wherein the inlet comprises a through hole defined in the cover, and the outlet comprises at least one cutout formed in the cover away from the through hole of the cover.

5. The cooling plate as claimed in claim 3, wherein the inlet comprises a through hole defined in the cover, and the outlet comprises a plurality of cutouts formed in the cover near the through hole in the cover.

6. The cooling plate as claimed in claim 5, wherein a ring-shaped space defined between the inner tube and the outer tube communicates with the outlet, and is independent from the inlet of the cover, and wherein the inner tube communicates with the inlet, and is independent from the outlet of the cover.

7. The cooling plate as claimed in claim 6, wherein the inner tube and the outer tube are projecting from the cover towards a direction away from the base.

8. The cooling plate as claimed in claim 6, wherein the inner tube has a gradually decreased cross-sectional area from a free end thereof to the inlet of the cover.

9. The cooling plate as claimed in claim 3, wherein the cover comprises four sidewalls extending from four sides of the cover towards the base, wherein the sidewalls of the cover enclose a periphery of the base.

10. The cooling plate as claimed in claim 9, wherein the sidewalls of the cover are fixed to the periphery of the base for ensuring that the chamber is hermetically sealed.

11. The cooling plate as claimed in claim 1, further comprising a spring encircling the inner tube and the second pipe and received in the outlet.

* * * * *